(12) United States Patent
Haruna et al.

(10) Patent No.: US 7,939,843 B2
(45) Date of Patent: May 10, 2011

(54) LIGHT EMITTING DEVICE AND HIGH REFRACTIVE INDEX LAYER

(75) Inventors: Takao Haruna, Aichi-ken (JP); Akio Namiki, Aichi-ken (JP); Mitsuhiro Inoue, Aichi-ken (JP)

(73) Assignee: Toyoda Gosei Co., Ltd., Nishikasugai-gun, Aichi-ken (JP)

( * ) Notice: Subject to any disclaimer, the term of this patent is extended or adjusted under 35 U.S.C. 154(b) by 184 days.

(21) Appl. No.: 11/976,614

(22) Filed: Oct. 25, 2007

(65) Prior Publication Data

US 2008/0128732 A1 Jun. 5, 2008

(30) Foreign Application Priority Data

Oct. 26, 2006 (JP) ................................. 2006-291680

(51) Int. Cl.
*H01L 33/00* (2010.01)
(52) U.S. Cl. .................. 257/98; 257/100; 257/E33.073
(58) Field of Classification Search .................. 257/98, 257/100, E33.073
See application file for complete search history.

(56) References Cited

U.S. PATENT DOCUMENTS

| | | | | |
|---|---|---|---|---|
| 5,959,316 A | * | 9/1999 | Lowery | 257/98 |
| 6,155,699 A | * | 12/2000 | Miller et al. | 362/293 |
| 6,417,019 B1 | * | 7/2002 | Mueller et al. | 438/29 |
| 6,635,363 B1 | * | 10/2003 | Duclos et al. | 428/690 |
| 6,777,871 B2 | * | 8/2004 | Duggal et al. | 313/506 |
| 6,791,116 B2 | * | 9/2004 | Takahashi et al. | 257/79 |
| 6,890,234 B2 | * | 5/2005 | Bortscheller et al. | 445/25 |
| 7,301,175 B2 | * | 11/2007 | Izuno et al. | 257/98 |

(Continued)

FOREIGN PATENT DOCUMENTS

JP 10-65220 3/1998

(Continued)

*Primary Examiner* — Teresa M Arroyo
(74) *Attorney, Agent, or Firm* — McGinn Intellectual Property Law Group, PLLC

(57) ABSTRACT

A light emitting device has a light emitting element, and a high-refractive index layer that contacts an emission surface of the light emitting element. The high-refractive index layer has transparent fine particles uniformly arranged along the emission surface. The fine particles has a refractive index high than that of a material composing the emission surface of the light emitting element. Otherwise, a light emitting device has a light emitting element, a sealing material for sealing the light emitting element, and a high-refractive index layer that contacts an emission surface of the light emitting element. The fine particles has a refractive index high than that of a material composing the emission surface of the light emitting element and that of the sealing material. A phosphor may be included in the sealing material which is adapted to emit a wavelength-converted light by being excited by a light emitted from the light emitting element. The phosphor may have a same matrix as the fine particles, and it may be formed spherical. The light emitting element may be a face-up type light emitting element or a flip-chip type light emitting element.

15 Claims, 9 Drawing Sheets

U.S. PATENT DOCUMENTS

| | | | |
|---|---|---|---|
| 7,521,727 B2 * | 4/2009 | Khanarian et al. | 257/98 |
| 7,569,863 B2 * | 8/2009 | Ueda | 257/97 |
| 2002/0070449 A1 * | 6/2002 | Yagi et al. | 257/734 |
| 2004/0253427 A1 * | 12/2004 | Yokogawa et al. | 428/212 |
| 2005/0093008 A1 * | 5/2005 | Suehiro et al. | 257/98 |
| 2005/0199887 A1 * | 9/2005 | Suehiro et al. | 257/79 |
| 2005/0224830 A1 * | 10/2005 | Blonder et al. | 257/100 |
| 2005/0230691 A1 * | 10/2005 | Amiotti et al. | 257/79 |
| 2006/0001035 A1 * | 1/2006 | Suehiro et al. | 257/91 |
| 2006/0220539 A1 * | 10/2006 | Cok et al. | 313/506 |
| 2007/0222365 A1 * | 9/2007 | Tamamura | 313/498 |
| 2007/0253062 A1 * | 11/2007 | Shimoda et al. | 359/580 |
| 2008/0121917 A1 * | 5/2008 | Weisbuch et al. | 257/98 |
| 2008/0157113 A1 * | 7/2008 | Hayashi | 257/98 |

FOREIGN PATENT DOCUMENTS

| | | | |
|---|---|---|---|
| JP | 10065220 A | * | 3/1998 |
| JP | 2000150965 A | * | 5/2000 |
| JP | 2002033521 A | * | 1/2002 |
| JP | 2003-243727 | | 8/2003 |
| JP | 2003249682 A | * | 9/2003 |
| JP | 2006261540 A | * | 9/2006 |
| JP | 2007258486 A | * | 10/2007 |

* cited by examiner

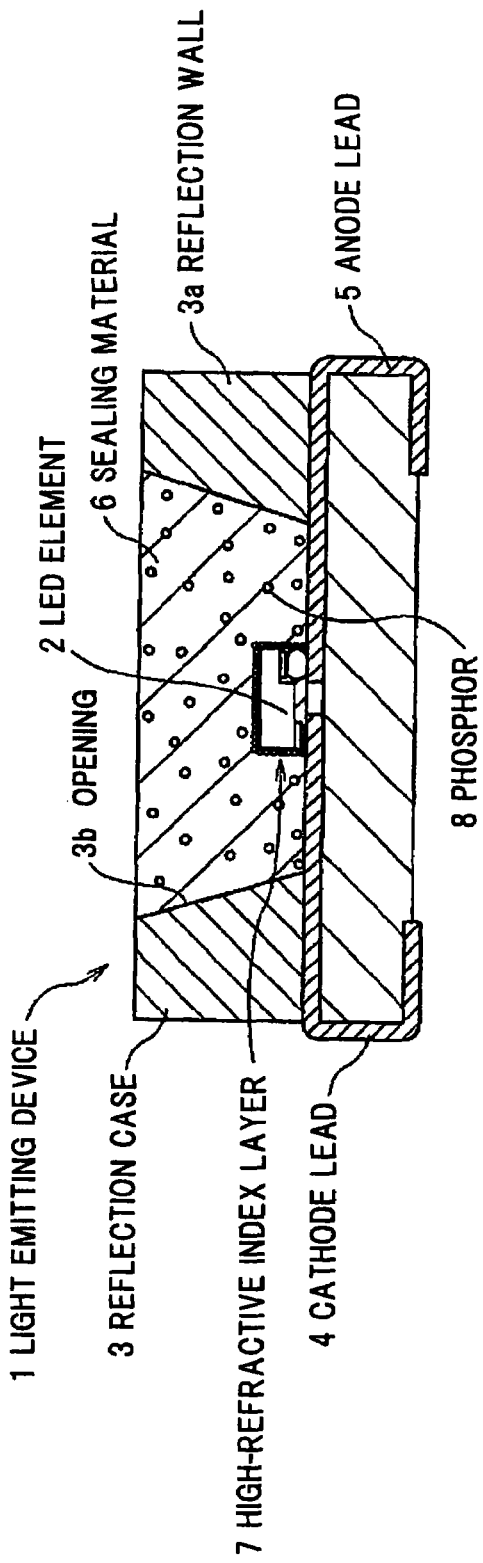

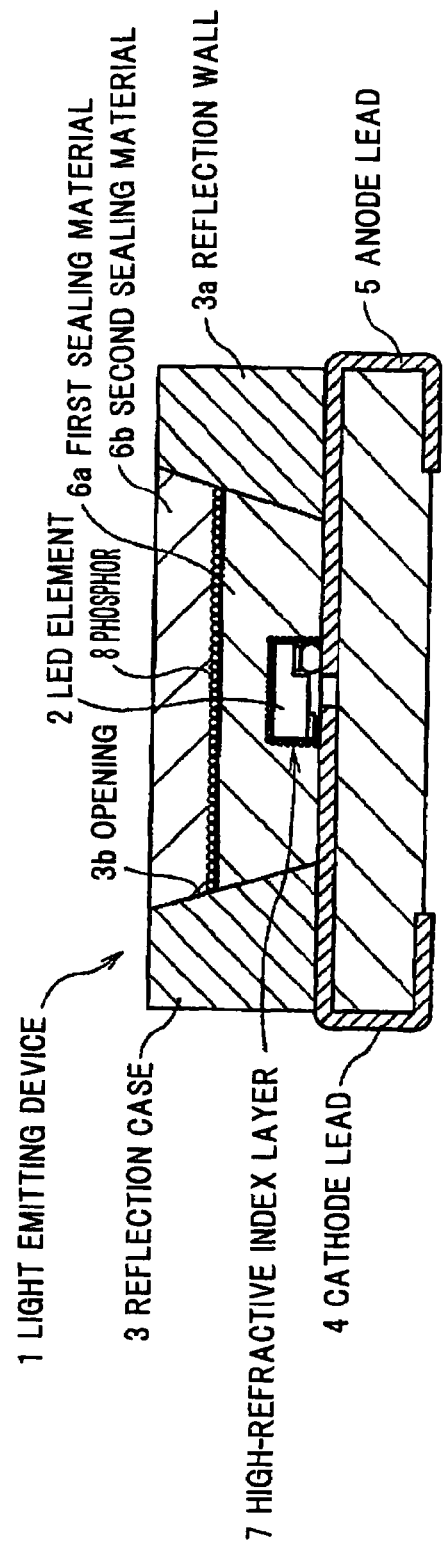

LIGHT EMITTING DEVICE AND HIGH REFRACTIVE INDEX LAYER

The present application is based on Japanese patent application No. 2006-291680 filed on Oct. 26, 2006, the entire contents of which are incorporated herein by reference.

BACKGROUND OF THE INVENTION

1. Field of the Invention

This invention relates to a light emitting device with a light emitting element on the surface of which a high refractive index layer is formed.

2. Description of the Related Art

Light emitting devices are conventionally known in which a light emitting element such as an LED (=light emitting diode) is sealed with a transparent resin material such as epoxy resin. In this kind of light emitting device, since the surface portion (or a surface layer located on light extraction surface side thereof) of the light emitting element has a refractive index higher than that of the transparent resin material, a range of angle is defined within which the condition of total reflection can be satisfied at the interface of the light emitting element and the sealing material. It is impossible to extract a light emitted from the inside of the light emitting element and entering into the interface at an angle within that range of angle.

JP-A-10-65220 discloses a light emitting device with improved light extraction efficiency. In this light emitting device, the periphery of the light emitting element is sealed by a first resin such as polyvinylcarbazole, and the outside of the first rein is sealed by a second resin with a refractive index lower than the first resin. The light extraction efficiency of light emitted from the light emitting element can be enhanced as compared to the case where the light emitting element is sealed by only epoxy resin.

JP-A-2003-243727 discloses a light emitting device that a coating layer including phosphor particles therein is formed on the surface of the light emitting element. The phosphor particles are operable to convert a part of light emitted from the light emitting element, where light emitted from the light emitting element is combined with the converted light radiated from the phosphor particles to produce white light. The coating layer further includes fine particles of a transparent inorganic material so as to improve the emission characteristics of the device, where it has a region with the thick fine particles and a region with the thin fine particles formed therein.

However, the light emitting device of JP-A-10-65220 still retains the range of angle to satisfy the condition of total reflection since the first resin covering the periphery of the light emitting element is lower in refractive index than the surface portion of the light emitting element. Thus, the device of JP-A-10-65220 is insufficient in light extraction efficiency.

The light emitting device of JP-A-2003-243727 has the region with the thin fine particles on the periphery of the light emitting device, where the amount of the fine particles significantly lowers to allow the surface of the light emitting element to be covered with the resin sealing material which causes a reduction in light extraction efficiency. Thus, the device of JP-A-2003-243727 is not intended to improve the light extraction efficiency from the light emitting element.

SUMMARY OF THE INVENTION

It is an object of the invention to provide a light emitting device that can be improved in light extraction efficiency from the light emitting element.

(1) According to one embodiment of the invention, a light emitting device comprises:
  a light emitting element; and
  a high-refractive index layer that contacts an emission surface of the light emitting element,
  wherein the high-refractive index layer comprises transparent fine particles uniformly arranged along the emission surface, and
  the fine particles comprise a refractive index higher than that of a material composing the emission surface of the light emitting element.

In the above light emitting device (1), since the refractive index of the transparent fine particles is higher than that of the surface material of the light emitting element, the total-reflection condition is not established in relation to incident light entering into the transparent fine particles of the high-refractive index layer from the inside of the light emitting element. Thus, the incident light can be extracted without being reflected at the interface between the light emitting element and the transparent fine particles. Light entering into the transparent fine particle of the high-refractive index layer can be externally discharged from the interface of the transparent fine particle opposed to the light emitting element.

(2) According to another embodiment of the invention, a light emitting device comprises:
  a light emitting element;
  a sealing material for sealing the light emitting element; and
  a high-refractive index layer that contacts an emission surface of the light emitting element,
  wherein the high-refractive index layer comprises transparent fine particles uniformly arranged along the emission surface, and
  the fine particles comprise a refractive index higher than that of a material composing the emission surface of the light emitting element and that of the sealing material.

In the above light emitting device (2), since the refractive index of the transparent fine particles is higher than that of the surface material of the light emitting element, incident light entering into the transparent fine particles of the high-refractive index layer from the inside of the light emitting element can be extracted without being reflected at the interface between the light emitting element and the transparent fine particles. Light entering into the transparent fine particle of the high-refractive index layer can be discharged toward the sealing material from the interface of the transparent fine particle and the sealing material.

(3) According to another embodiment of the invention, a light emitting device comprises:
  a light emitting element;
  a sealing material for sealing the light emitting element;
  a phosphor included in the sealing material and adapted to emit a wavelength-converted light by being excited by a light emitted from the light emitting element; and
  a high-refractive index layer that contacts an emission surface of the light emitting element,
  wherein the high-refractive index layer comprises transparent fine particles uniformly arranged along the emission surface, and
  the fine particles comprise a refractive index higher than that of a material composing the emission surface of the light emitting element.

In the above light emitting device (3), since the refractive index of the transparent fine particles is higher than that of the surface material of the light emitting element, incident light entering into the transparent fine particles of the high-refractive index layer from the inside of the light emitting element can be extracted without being reflected at the interface between the light emitting element and the transparent fine particles. Light entering into the transparent fine particle of the high-refractive index layer can be discharged toward the sealing material from the interface of the transparent fine particle and the sealing material. Of lights discharged toward the sealing material, light entering into the phosphor can be wavelength-converted by the phosphor and extracted from the light emitting device.

In the above embodiments (1) to (3), the following modifications, changes and a combination thereof can be made.

(i) The phosphor comprises a same matrix as the fine particles.

(ii) The fine particles comprise a YAG (yttrium aluminum garnet) based material with no activator element.

(iii) The light emitting element comprises a face-up type light emitting element comprising a semiconductor layer grown on a growth substrate and a passivation film covering the semiconductor layer, and the high-refractive index layer is formed on the passivation film.

(iv) The passivation film comprises $SiO_2$.

(v) The light emitting element comprises a flip-chip type light emitting element comprising a transparent growth substrate, and the high-refractive index layer is formed on the growth substrate.

(vi) The growth substrate comprises sapphire.

(vii) The fine particles comprise an outer diameter shorter than a wavelength of light emitted from the light emitting element.

ADVANTAGES OF THE INVENTION

According to the invention, incident light entering into the transparent fine particles of the high-refractive index layer from the inside of the light emitting element can be extracted without being reflected at the interface between the light emitting element and the transparent fine particles, so that light extraction efficiency from the light emitting element can be enhanced.

BRIEF DESCRIPTION OF THE DRAWINGS

The preferred embodiments according to the invention will be explained below referring to the drawings, wherein:

FIG. 6 is a schematic cross sectional view showing a light emitting device in a modification of the embodiment according to the invention;

FIG. 7 is a schematic cross sectional view showing a light emitting device in another modification of the embodiment according to the invention;

DETAILED DESCRIPTION OF THE PREFERRED EMBODIMENTS

Figure 1:
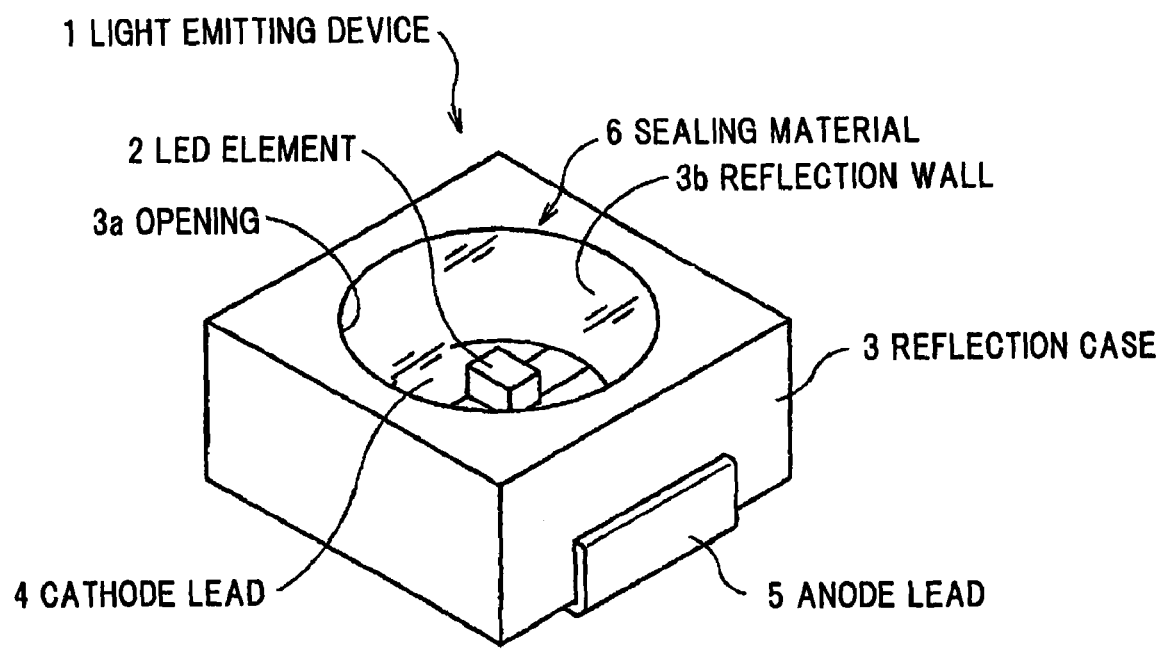
FIG. 1 is a schematic perspective view showing a light emitting device in a preferred embodiment according to the invention.

FIGS. 1 to 5B show a preferred embodiment according to the invention, where FIG. 1 is a schematic perspective view showing a light emitting device in the embodiment.

As shown in FIG. 1, the light emitting device 1 is composed of an LED element 2 and a reflection case 3 on which the LED element 2 is mounted. The reflection case 3 has a reflection wall 3a surrounding the LED element 2, and an opening 3b for light extraction on the top end of the reflection wall 3a. A cathode (=positive electrode) lead 4 and an anode (=negative electrode) lead 5 to be connected with electrodes of the LED element 2 are disposed at the bottom of the reflection case 3. As shown in FIG. 1, the cathode lead 4 and the anode lead 5 are extended to the outside of the reflection case 3. A sealing material 6 is filled inside the reflection wall 3a of the reflection case 3 to seal the LED element 2.

Figure 2:
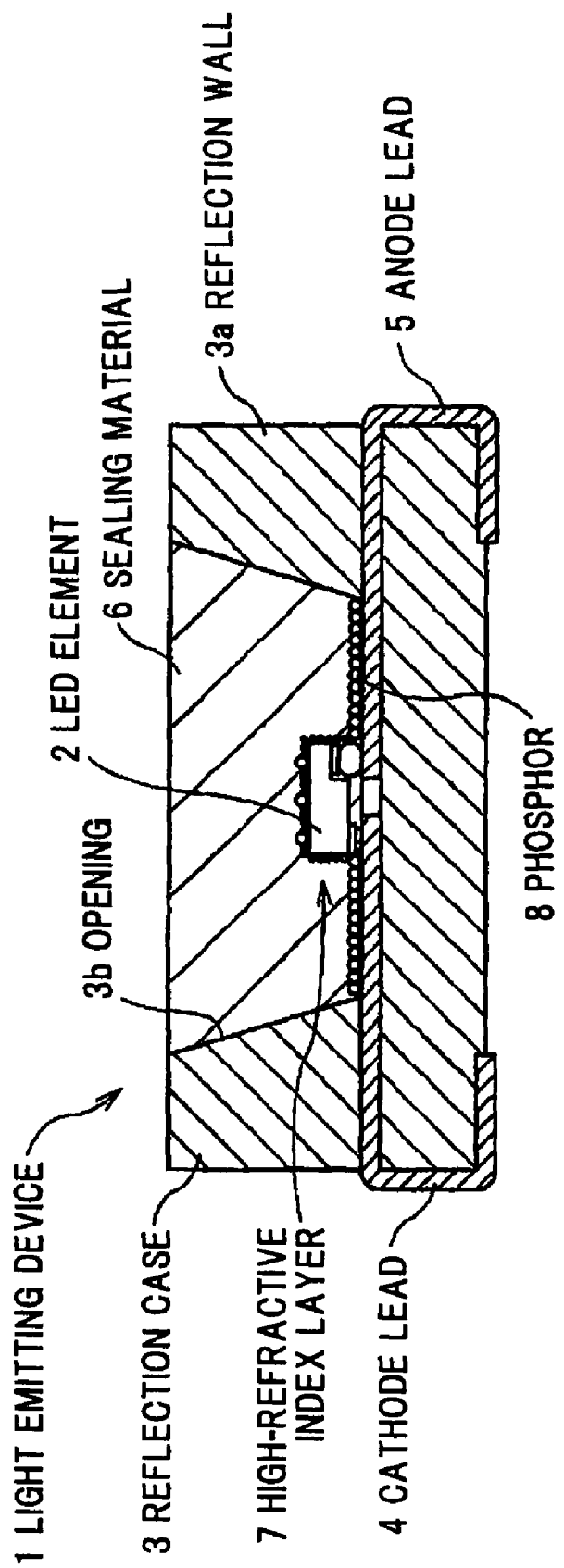
FIG. 2 is a schematic cross sectional view showing the light emitting device.

FIG. 2 is a schematic cross sectional view showing the light emitting device 1. As shown, the light emitting device 1 is further composed of a high-refractive index layer 7 covering the surface of the LED element 2. As described later, the high-refractive index layer 7 includes a transparent fine particle 7a. The sealing material 6 includes a phosphor 8, where the phosphor 8 settles down during the formation of the sealing material 6 so that the leads 4 and 5 and a part of the LED element 2 are covered with the phosphor particles 8.

Figure 3:
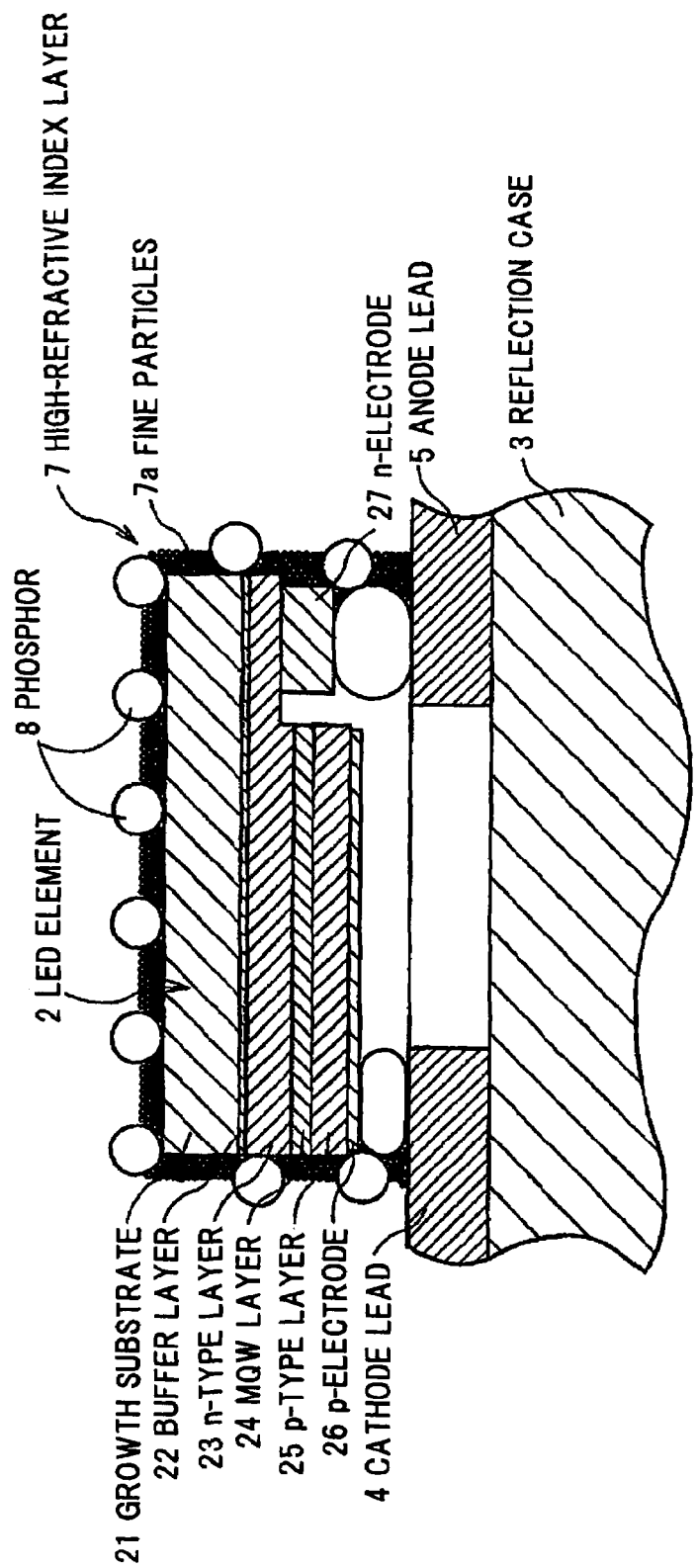
FIG. 3 is an enlarged schematic cross sectional view showing a light emitting element mounted in the light emitting device.

The LED element 2 of the embodiment will be explained below referring to FIG. 3. FIG. 3 is an enlarged schematic cross sectional view showing the LED element 2 mounted in the light emitting device 1. The LED element 2 is of a flip-chip type, and is composed of, formed on a growth substrate 21, a buffer layer 22, an n-type layer 23, an MQW (multiquantum well) layer 24 and a p-type layer 25 in this order. The growth substrate 21 is a main emission surface. A p-electrode 26 is formed on the p-type layer 25, and an n-electrode 27 is formed on the n-type layer 23. The LED element 2 is operable to emit light with a peak wavelength in a blue spectral region from the MQW layer 24.

In this embodiment, the growth substrate 21 is a sapphire substrate with a refractive index of 1.77. The material of the growth substrate 21 is not limited to sapphire and may be spinel, silicon, silicon carbide, zinc oxide, group III nitride based compound semiconductor single crystal etc.

The buffer layer 22 is formed by MOCVD using AlN. The material of the buffer layer 22 is not limited to AlN, and may be GaN, InN, AlGaN, InGaN, AlInGaN etc. The growth method thereof may be MBE (molecular beam epitaxy), HVPE (hydride vapor phase epitaxy), sputtering, ion-plating, electron shower etc.

The n-type layer 23 is formed of GaN doped with Si as an n-type impurity. Although in this embodiment the n-type layer 23 is formed of GaN, it may be formed of AlGaN, InGaN or AlInGaN. The n-type impurity doped into the n-type layer 23 may be Ge, Se, Te, C etc. other than Si.

The MQW layer 24 is formed with predetermined pairs of QW (quantum well), and includes plural blue-emission well layers and plural barrier layers disposed between the blue-emission well layers. The blue-emission well layers are each formed of InGaN and the barrier layers are each formed of GaN. The blue-emission well layers each emit a light with a peak wavelength of about 460 nm.

The p-type layer 25 is formed of GaN doped with Mg as a p-type impurity. Although in this embodiment the p-type layer 25 is formed of GaN, it may be formed of AlGaN, InGaN or AlInGaN. The p-type impurity doped into the p-type layer 25 may be Zn, Be, Ca, Sr, Ba etc. other than Mg.

The p-electrode 26 is formed of a material including Au, and formed on the p-type layer 25 by deposition. The n-electrode 27 is composed of two layers of Al and V each. For example, after the p-type layer 25 is formed, a part of the p-type layer 25, the MQW layer 24 and the n-type layer 23 is removed by etching and the n-type layer 27 is then formed on the n-type layer 23 by deposition.

The LED element 2 thus composed is flip-chip mounted on the bottom of the reflection case 3, where the electrodes 26, 27 are connected to the leads 4, 5 through an Au bump 9. Although in FIG. 3 the LED element 2 is directly connected to the leads 4, 5, a Zener diode may be inserted between the LED element 2 and the leads 4, 5 so as to protect the LED element 2 from overcurrent.

As shown in FIG. 3, the surface of the LED element 2 is covered with the high-refractive index layer 7 as an aggregate of the transparent fine particles 7a. Thus, the sapphire substrate (=growth substrate 21) forming the main emission surface of the flip-chip type LED element 2 is covered with the high-refractive index layer 7. Herein, "transparent" means having substantially no absorption to an emission wavelength of the LED element 2. The transparent fine particle 7a is, as a matrix, formed of a YAG (yttrium aluminum garnet) based material not doped with any activator elements such as Ce and Eu. It is 1.83 in refractive index and 10 nm in average diameter. Thus, the transparent fine particle 7a is higher in refractive index than the growth substrate 21 of sapphire (1.77) and the sealing material 6 of silicon (1.41). It is preferred that the transparent fine particle 7a has a diameter of one fourth or less of the emission wavelength of the LED element 2. In this embodiment, the transparent fine particle 7a has preferably a diameter of one fourth or less, i.e., 115 nm or less, of the emission wavelength, 460 nm.

The high-refractive index layer 7 is 7 μm in thickness. The thickness of the high-refractive index layer 7 may be suitably varied in the range of 1 nm to 10 μm. The high-refractive index layer 7 is formed such that when the sealing material 6 with the transparent fine particles 7a included therein is molded, the transparent fine particles 7a settle down as a layer on the surface of the LED element 2 to be attached thereto. Alternatively, the transparent fine particle 7a may be attached to the LED element 2 to form the high-refractive index layer 7 before the sealing process. Thus, the high-refractive index layer 7 can be formed by using suitable methods other than the above methods.

Figure 4:
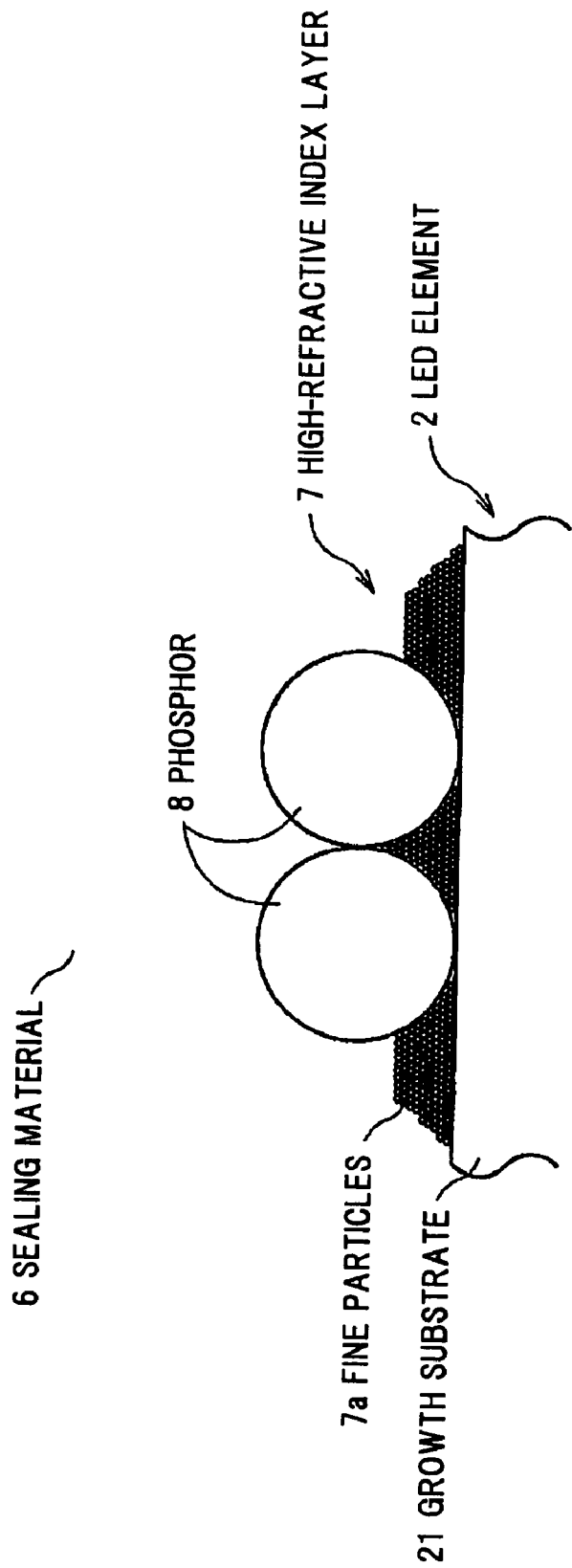
FIG. 4 illustrates a state that fine particles and phosphors are in contact with the surface of an LED element.

The sealing material 6 is formed of, e.g., transparent resin, glass etc. and filled inside the reflection case 3. In this embodiment, the sealing material 6 is formed of silicon with a refractive index of 1.41. The phosphor 8 included in the sealing material 6 is a yellow phosphor of, e.g., cerium-activated YAG. Thus, the phosphor 8 has the same matrix as the transparent fine particle 7a. The phosphor 8 emits yellow light as wavelength-converted light by being excited blue light emitted from the LED element 2. The phosphor 8 is 1.83 in refractive index and 10 μm in average diameter, and covers a part of the surface of the LED element 2. For example, as shown in FIG. 4, the phosphor particles 8 are interposed in the high-refractive index layer 7 composed of a number of transparent fine particles 7a. The average diameter of the phosphor 8 can be suitably changed in the range of 1 μm to 30 μm.

In the light emitting device 1 thus constructed, when current is fed through the leads 4, 5 to the LED element 2, the MQW layer 24 emits blue light and a part of the blue light is wavelength-converted by the phosphor 8 to yield yellow light. Thus, the blue light (not converted) is mixed with the yellow light to allow white light to be extracted from the opening 3b.

Figure 5A:
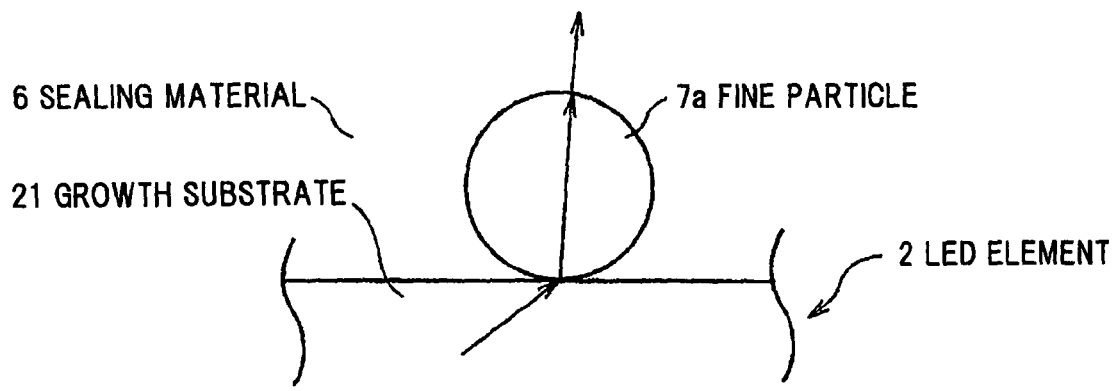
FIGS. 5A and 5B illustrate optical paths on the surface of the LED element.
Figure 5B:
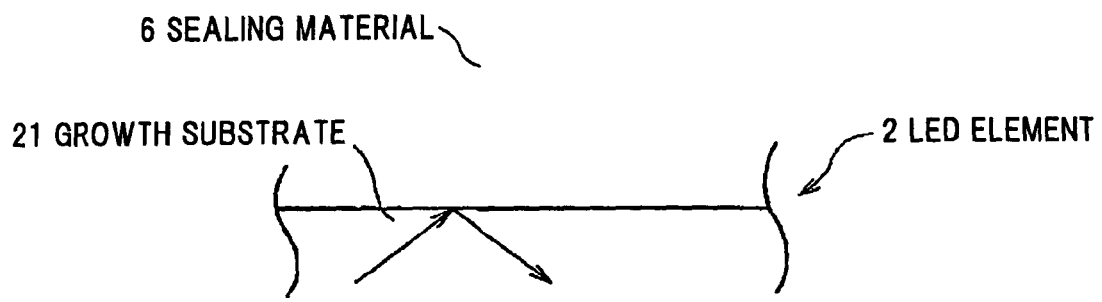

In this case, since the transparent fine particle 7a is higher in refractive index than the growth substrate 21 forming the surface portion of the LED element 2, no total-reflection condition is established in relation to light entering into the transparent fine particle 7a of the high-refractive index layer 7 from the inside (or surface portion) of the LED element 2. As a result, as shown in FIG. 5A, incident light from the inside of the LED element 2 can be mostly extracted without being reflected at the interface between the LED element 2 (i.e., surface portion) and the transparent fine particle 7a. Especially in this embodiment, the growth substrate 21 of sapphire with a refractive index of 1.77 and forming the main emission surface is covered with the high-refractive index layer 7. Therefore, most of the incident light can be extracted without causing the total reflection. In contrast, in case of having no transparent fine particles 7a, as shown in FIG. 5B, the incident light cannot be extracted at an angle region where the total-reflection condition is satisfied. Light entering into the transparent fine particle 7a of the high-refractive index layer 7 is discharged into the sealing material 6 (or passing through the stacked transparent fine particles 7a toward the sealing material 6) through the interface between the transparent fine particle 7a and the sealing material 6.

As described above, the light emitting device 1 of this embodiment can extract the incident light from the inside of the LED element 2 without causing its total reflection at the interface of the LED element 2 (i.e., growth substrate 21) and the transparent fine particle 7a. Thereby, the light extraction efficiency of the LED element 2 can be enhanced.

Furthermore, the light emitting device 1 of this embodiment has the spherical transparent fine particles 7a. Therefore, light with an incident angle greater than a critical angle to meet the total-reflection condition does not enter into the interface between the transparent fine particle 7a and the sealing material 6 from the inside of the transparent fine particle 7a (See FIG. 5A). Thus, all of lights entering into the transparent fine particle 7a from the LED element 2 can be extracted from the transparent fine particle 7a. Of lights discharged toward the sealing material 6, light entering into the phosphor 8 is wavelength-converted by the phosphor 8 and discharged from the opening 3a.

In the light emitting device 1 of this embodiment, the diameter of the transparent fine particle 7a is shorter than the wavelength of blue light emitted from the LED element 2. Therefore, the emitted light is discharged toward the sealing material 6 without interfering with the transparent fine particle 7a so that the light extraction efficiency can be significantly enhanced. In addition, since the transparent fine particle 7a is 10 nm in diameter, the surface of the LED element 2 can be covered almost with no space therebetween as compared to a case where the high-refractive index layer 7 is formed of particles, 20 μm or so in diameter, like the phosphor 8.

Furthermore, the light emitting device 1 of this embodiment is constructed such that the phosphor 8 has the same matrix as the transparent fine particle 7a. Therefore, even when the phosphor 8 is interposed in the high-refractive index layer 7 to allow a part of the surface of the LED element 2 to be covered with the phosphor 8, the light extraction efficiency at the contact portion between the phosphor 8 and the LED element 2 is not different from that between the transparent fine particle 7a and the LED element 2 since there is no difference in refractive index between the transparent fine particle 7a and the phosphor 8. Further, by placing the phosphor 8 close to the LED element 2, unevenness in emission color of light discharged from the opening 3a can be reduced.

Although the above embodiment is demonstrated such that the phosphor 8 settles down in the sealing material 6, the phosphor 8 may be dispersed in the sealing material 6 as shown in FIG. 6.

Alternatively, as shown in FIG. 7, the sealing material 6 may be composed of a first sealing material 6a for sealing the LED element 2 and a second sealing material 6b including the phosphor 8 therein, which can be separately formed. In this case, the first sealing material 6a is molded after the transparent fine particles 7a settle down, and the second sealing material 6b is molded after the phosphors 8 settle down on the first sealing material 6a. The first sealing material 6a and the second sealing material 6b are formed of the same material so as not to cause reflection, refraction etc. at the interface therebetween.

Alternatively, the light emitting device 1 may be constructed without the phosphor 8 so that light from the LED element 2 is extracted without being wavelength-converted.

Although the above embodiment is demonstrated such that white light is obtained by combining the blue LED element 2 and the yellow phosphor 8, the invention is not to this combination. For example, in order to obtain white light, a ultraviolet LED element may be combined with a blue phosphor for radiating blue light by being excited by the UV light, a green phosphor for radiating green light by being excited by the UV light, and a red phosphor for radiating red light by being excited by the UV light.

Figure 8:
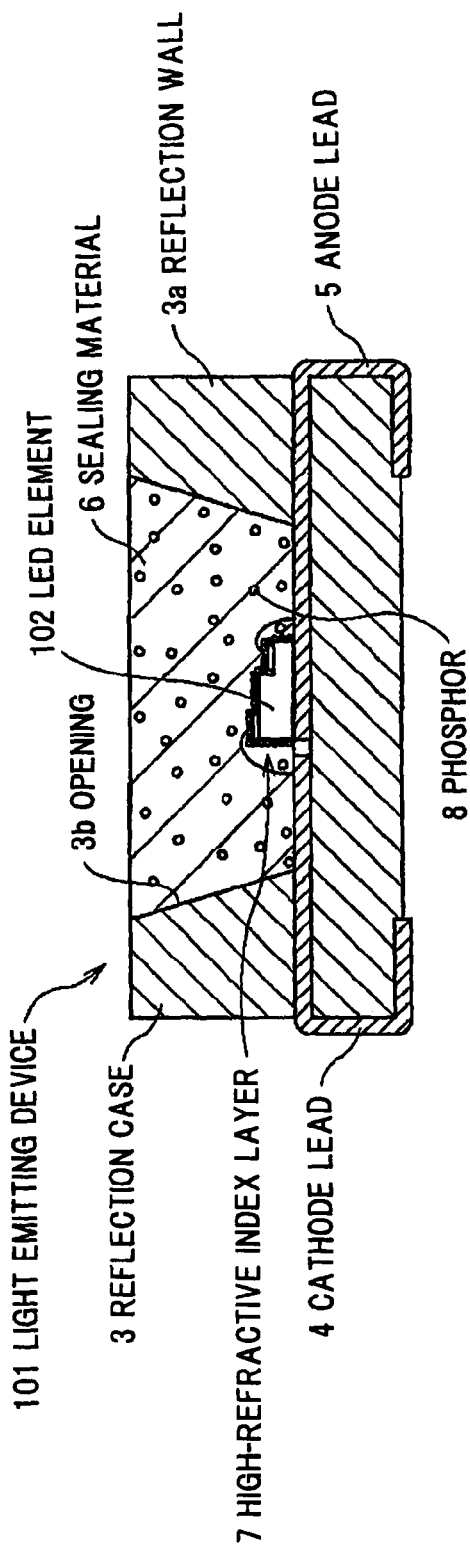
FIG. 8 is a schematic cross sectional view showing a light emitting device in another modification of the embodiment according to the invention.
Figure 9:
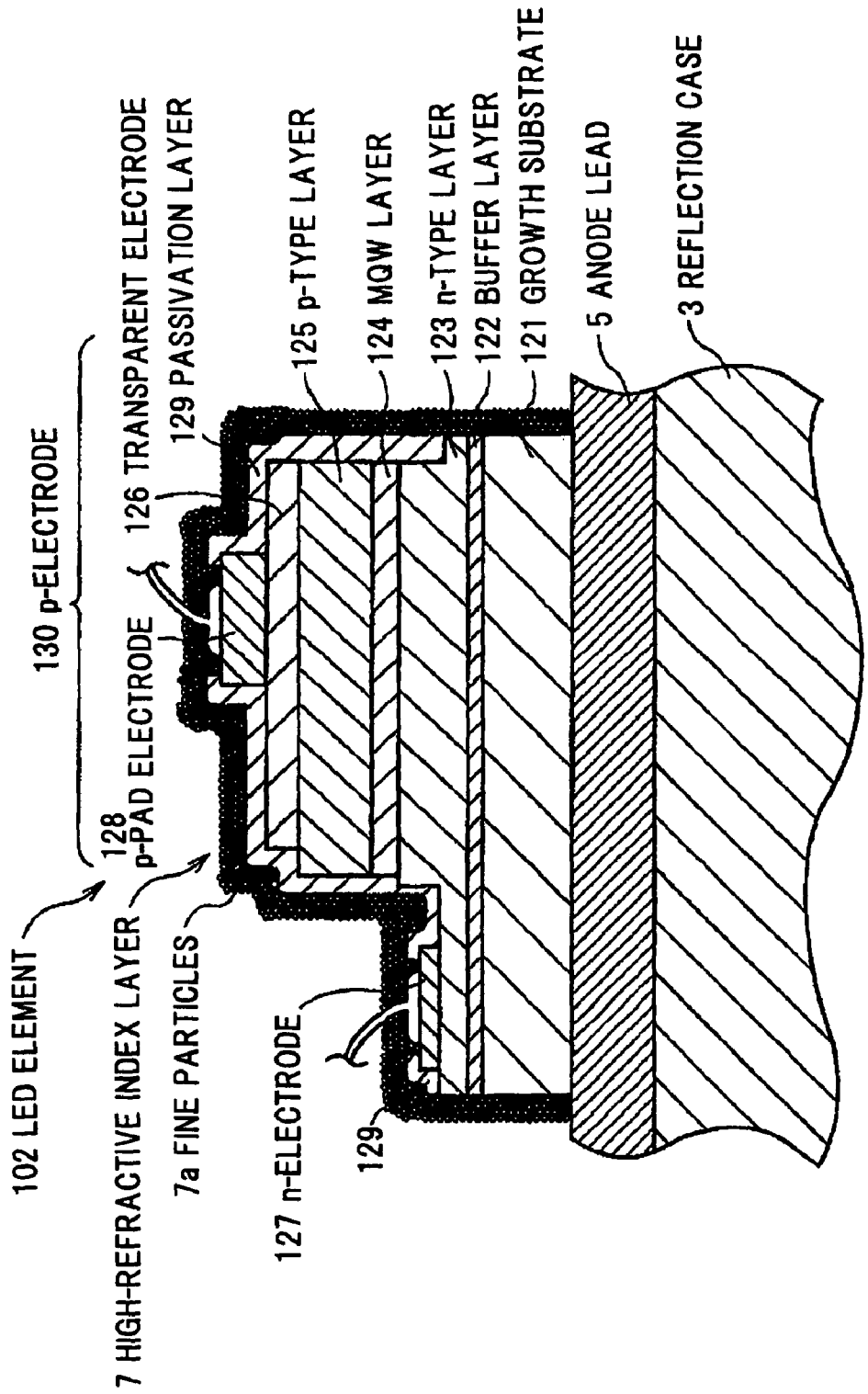
FIG. 9 is schematic cross sectional view showing a mounting portion of a light emitting device in another modification of the embodiment according to the invention.

Although the above embodiment is demonstrated such that the LED element 2 is flip-chip mounted, the invention is not to this mount type. For example, as shown in FIG. 8, a light emitting device 101 may be constructed such that a face-up type LED element 102 is mounted. As shown in FIG. 9, the light emitting device 102 is composed of, formed on a growth substrate 121, a buffer layer 122, an n-type layer 123, an MQW layer 124, and a p-type layer 125 in this order. A p-side pad electrode 128 is formed through a transparent electrode 126 on the p-type layer 125. A p-electrode 130 is composed the transparent electrode 126 and the p-side pad electrode 128.

A part of the p-type layer 125, the MQW layer 124 and the n-type layer 123 is removed by etching and an n-electrode 127 is formed on the etched part of the n-type layer 123. Further, a passivation film 129 of $SiO_2$ with a refractive index of 1.46 is formed on the electrode formation surface side of the LED element 102, and it forms a main emission surface of the LED element 102. As shown in FIG. 9, the passivation film 129 is also formed on the opposite side to the n-electrode 127 of the LED element 102. The high-refractive index layer 7 is formed on the passivation film 129.

In the light emitting device 101, the transparent fine particle 7a is higher in refractive index than the passivation film 129 formed on the surface of the LED element 102. Therefore, the total-reflection condition is not established in relation to incident light entering into the transparent fine particle 7a of the high-refractive index layer 7 from the inside of the LED element 102. Thus, the incident light can be extracted without being reflected at the interface between the LED element 2 and the transparent fine particle 7a.

Although the above embodiment is demonstrated such that the transparent fine particle 7a is formed of YAG, the invention is not to this material. For example, it may be formed of zirconium oxide, silicon nitride, silicon carbide, GaN-based materials, sialon-based materials, BOS (barium orthosilicates)-based materials etc. In brief, it only has to be a material with a refractive index higher than the surface portion of the LED element 102. Where the phosphor 8 is formed of the BOS-based materials or the sialon-based materials activated by europium etc., it is preferred that the transparent fine particle 7a is formed of the BOS-based materials or the sialon-based materials which are the same matrix as the phosphor 8 for the same reason as described earlier.

Although the above embodiment is demonstrated such that the light emitting device is of SMD (surface-mounted device) type, the invention is not to this device type. For example, the invention may be applied to a bullet (or lamp) type light emitting device or a side view type light emitting device. Further, the concrete detailed structure of the above light emitting devices can be suitably changed.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A light emitting device, comprising:
a light emitting element including GaN-based materials; and
a high-refractive index layer that directly contacts an emission surface of the light emitting element,
wherein the high-refractive index layer comprises transparent fine particles uniformly arranged along the emission surface,
the transparent fine particles comprise a refractive index higher than that of a material composing the emission surface of the light emitting element, and a YAG (yttrium aluminum garnet) based material with no activator element, and
the transparent fine particles have substantially no absorption to an emission wavelength of the light emitting element.

2. The light emitting device according to claim 1, wherein:
the light emitting element comprises a face-up type light emitting element comprising a semiconductor layer grown on a growth substrate and a passivation film covering the semiconductor layer, and
the high-refractive index layer is formed on the passivation film.

3. The light emitting device according to claim 2, wherein:
the passivation film comprises $SiO_2$.

4. The light emitting device according to claim 1, wherein:
the light emitting element comprises a flip-chip type light emitting element comprising a transparent growth substrate, and
the high-refractive index layer is formed on the growth substrate.

5. The light emitting device according to claim 4, wherein:
the growth substrate comprises sapphire.

6. The light emitting device according to claim 1, wherein:
the fine particles comprise an outer diameter shorter than a wavelength of light emitted from the light emitting element.

7. A light emitting device, comprising:
a light emitting element including GaN-based materials;
a sealing material for sealing the light emitting element; and
a high-refractive index layer that directly contacts an emission surface of the light emitting element,
wherein the high-refractive index layer comprises transparent fine particles uniformly arranged along the emission surface, the transparent fine particles comprise a refractive index higher than that of a material composing the emission surface of the light emitting element and that of the sealing material, and a YAG (yttrium aluminum garnet) based material with no activator element, and the transparent fine particles have substantially no absorption to an emission wavelength of the light emitting element.

8. The light emitting device according to claim 7; wherein:
the fine particles comprise an outer diameter shorter than a wavelength of light emitted from the light emitting element.

9. A light emitting device, comprising:
a light emitting element including GaN-based materials;
a sealing material for sealing the light emitting element;
a phosphor included in the sealing material and adapted to emit a wavelength-converted light by being excited by a light emitted from the light emitting element; and
a high-refractive index layer that directly contacts an emission surface of the light emitting element,
wherein the high-refractive index layer comprises transparent fine particles uniformly arranged along the emission surface,
the transparent fine particles comprise a refractive index higher than that of a material composing the emission surface of the light emitting element, and a YAG (yttrium aluminum garnet) based material with no activator element, and the transparent fine particles have substantially no absorption to an emission wavelength of the light emitting element.

10. The light emitting device according to claim 9, wherein:
the phosphor comprises a same matrix as the fine particles.

11. The light emitting device according to claim 9, wherein:
the fine particles comprise an outer diameter shorter than a wavelength of light emitted from the light emitting element.

12. The light emitting device according to claim 1, wherein the fine particles are settled at an interface between the high-refractive index layer and the light emitting element.

13. The light emitting device according to claim 1, wherein the fine particles form a layer along the emission surface of the light emitting element such that the fine particles are attached to the emission surface of the light emitting element.

14. The light emitting device according to claim 9, wherein the phosphor comprises a plurality of phosphor particles, a portion of the phosphor particles being interposed in the high-refractive index layer.

15. The light emitting device according to claim 9, wherein the sealing material comprises:
a first sealing material layer;
a second sealing material layer; and
a phosphor layer disposed between the first sealing material layer and the second sealing material layer.

* * * * *